US006341136B1

(12) United States Patent
Hiiro

(10) Patent No.: US 6,341,136 B1
(45) Date of Patent: Jan. 22, 2002

(54) OPTICAL BEAM DEFLECTOR MODIFYING PHASES OF RESPECTIVE PORTIONS OF OPTICAL BEAM BY TWO ARRAYS OF OPTICAL PHASE MODULATORS

(75) Inventor: Hiroyuki Hiiro, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/519,885

(22) Filed: Mar. 6, 2000

(30) Foreign Application Priority Data

Mar. 4, 1999 (JP) ............................................ 11-057212

(51) Int. Cl.[7] .............................. H01S 3/10; H01S 3/08
(52) U.S. Cl. ........................... 372/26; 372/24; 372/101; 372/108; 372/98; 372/100; 372/92
(58) Field of Search .......................... 372/24, 108, 101, 372/98, 26, 100, 92, 99

(56) References Cited

U.S. PATENT DOCUMENTS 5,600,666 A * 2/1997 Hiiro ............................ 372/24

OTHER PUBLICATIONS

Goltsos, William. et al, "Agile beam steering using binary optics microlens arrays", Optical Engineering, vol. 29 No. 11, Nov. 1990, p. 1392–1397.

Milster, Tom D. et al, "Modeling and measurement of a micro–optic beam deflector", SPIE vol. 1625, p. 78–83, 1992.

Matic, Roy M., "Blazed phase liquid crystal beam steering", SPIE vol. 2120, p. 194–205, 1994.

* cited by examiner

*Primary Examiner*—Frank G. Font
*Assistant Examiner*—Armando Rodriguez
(74) *Attorney, Agent, or Firm*—Sughrue Mion, PLLC

(57) ABSTRACT

An optical beam deflector in which a crosssection of an incident optical (e.g., laser) beam is divided into a first plurality of portions (micro crosssections) by an array of first lenses, a plurality of phases of the optical beam in the first micro crosssections are respectively modified by an array of first optical phase modulators so that a desired phase distribution is realized over the crosssection of the optical beam, and thereafter the crosssection of the optical beam is further divided into a plurality of second micro crosssections, and a plurality of phases of the optical beam in the second micro crosssections are respectively modified by an array of second optical phase modulators. An array of second lenses is provided corresponding to the second optical phase modulators to collect a plurality of portions of the optical beam output from the second optical phase modulators. The first and second optical phase modulators are driven by a driving unit so that the optical beam output from the array of second lenses as a whole is finally directed in a desired direction of deflection or to a desired point.

5 Claims, 6 Drawing Sheets

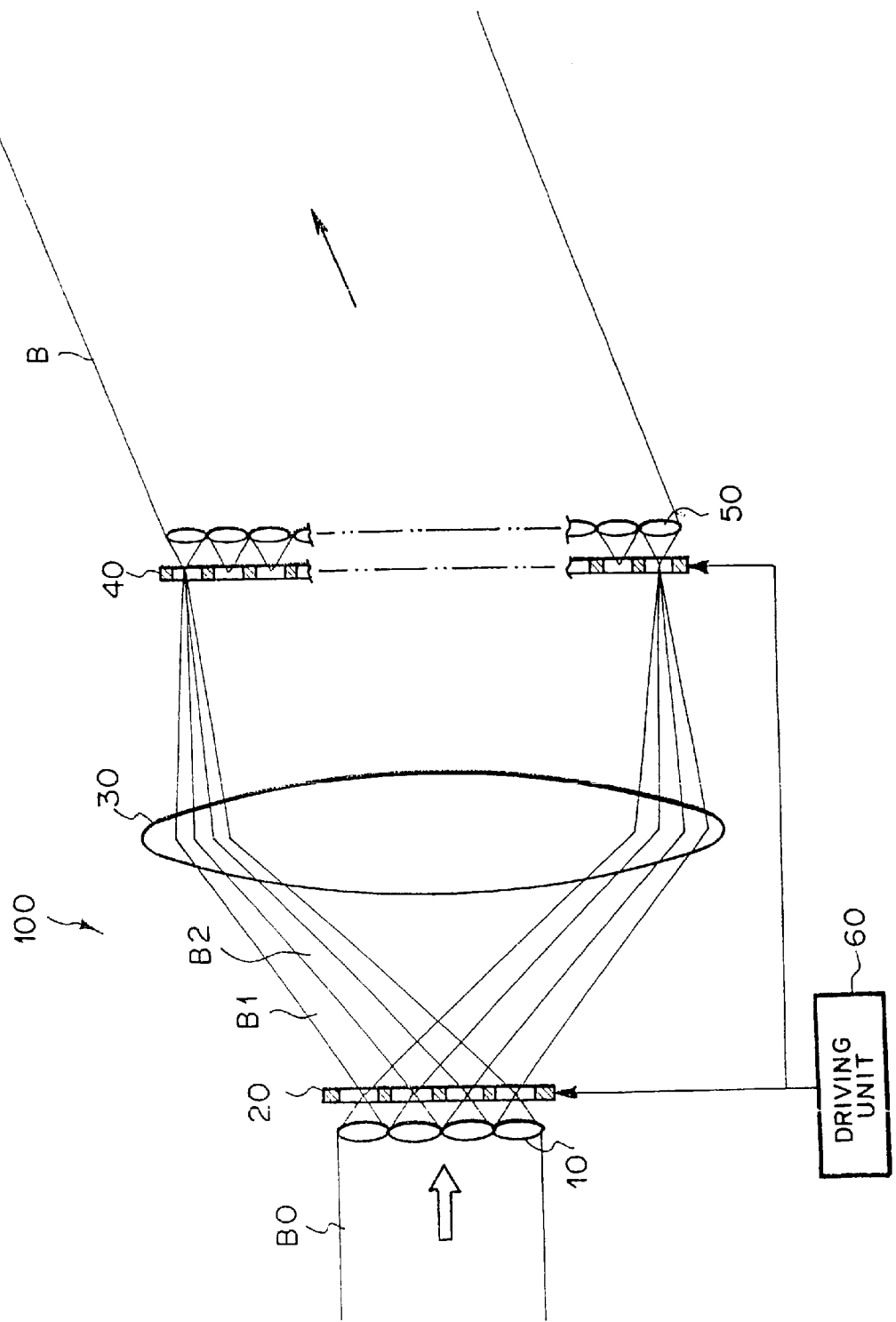

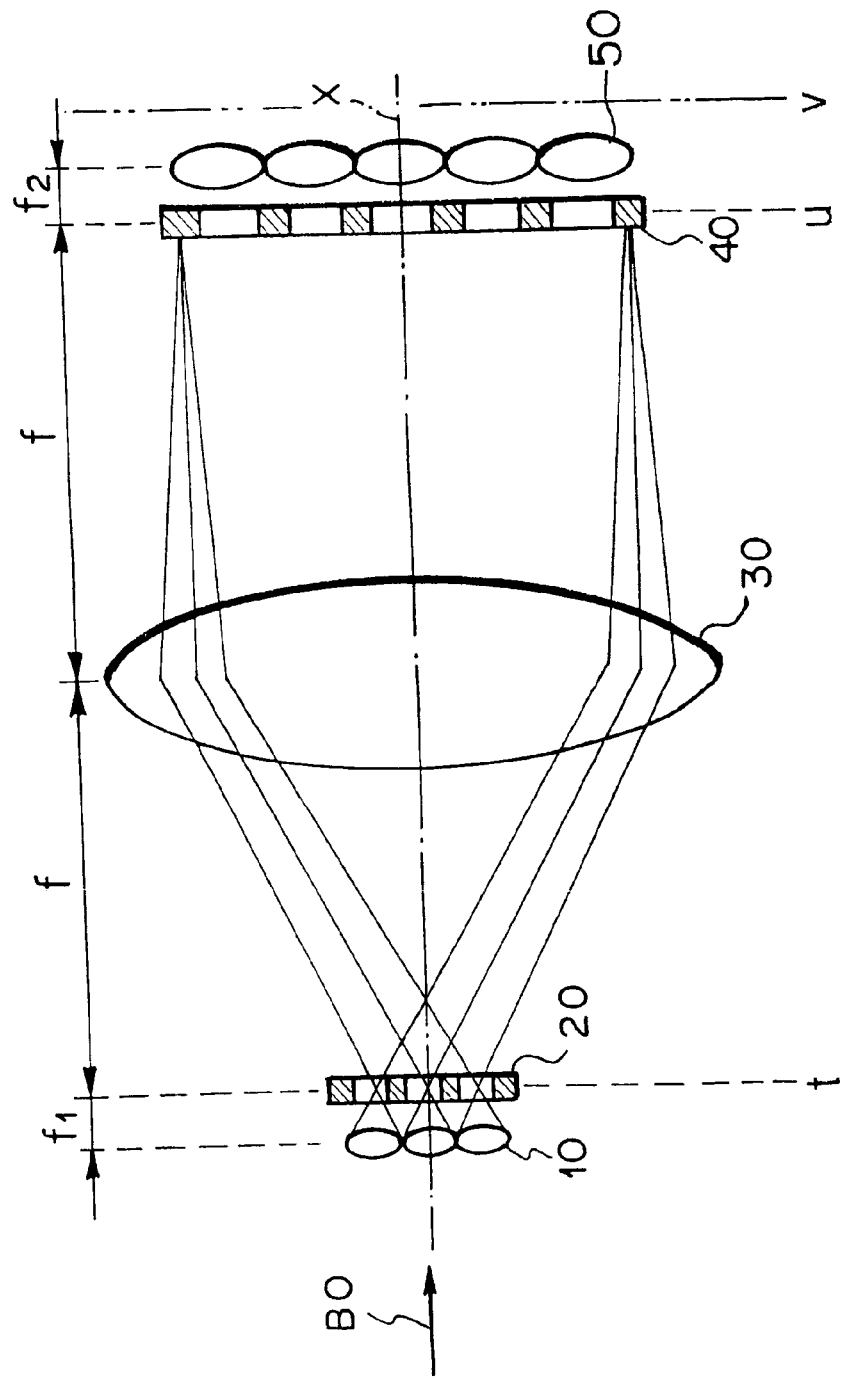

(LEFT EYE)  (RIGHT EYE)

OPTICAL BEAM DEFLECTOR MODIFYING PHASES OF RESPECTIVE PORTIONS OF OPTICAL BEAM BY TWO ARRAYS OF OPTICAL PHASE MODULATORS

BACKGROUND OF THE INVENTION

1. Field of the Invention

The present invention relates to an optical beam deflector. The optical beam deflector can be used, for example, for generating a scanning beam in a laser beam scanning apparatus, and the laser beam scanning device can be used in recording, reading, and displaying information, laser radar, intersatellite communication, and the like.

2. Description of the Related Art

Conventionally, the following techniques are proposed for optical beam deflectors:

(1) Laser Beam Deflectors Using Microlens Array (a) W. Goltsos, and M. Holz, "Agile Beam Steering Using Binary Optics Microlens Arrays," Optical Engineering, vol. 29 (1990), 1392.

(b) T. D. Milster and J. N. Wong, "Modeling and Measurement of Micro-Optic Beam Deflector," in "Design, Modeling, and Control of Laser Beam Optics," SPIE Proceedings, vol. 1625 (1992), 78–83.

In the techniques disclosed in the above references (a) and (b), two microlens arrays are provided in a telescope arrangement, and an incident laser beam is deflected by displacing one of the two microlens arrays in the direction perpendicular to the light axis. However, these techniques have the following drawbacks.

(i) Distributions of amplitudes and phases of the deflected beam are inequable, i.e., the deflected beam is not a single-peaked beam. Luminous energy of portions of the laser beam which are diffracted in directions other than the desired direction of deflection is lost, quality of the light beam is deteriorated, and performance of apparatuses utilizing the optical beam deflector is impaired.

(ii) Since the deflection is realized by mechanical displacement of the microlens array, it is not possible to perform agile, stable, and reliable scanning by using the above optical beam deflectors.

(2) Laser Beam Deflectors Using Liquid Crystal Phase Modulator Array

R. M. Matic, "Blazed Phase Liquid Crystal Beam Steering," SPIE Proceedings, vol. 2120 (1994), 194–205.

In the technique disclosed in the above reference, an incident laser beam is deflected in a desired direction by providing a distribution of phase modulation over the cross-section of the laser beam by using an array of optical phase modulators. However, due to use of only one array of optical phase modulators, this technique has the following drawbacks.

(i) Dead spots or stripe-shaped electrode areas of the array of optical phase modulators cause loss of luminous energy, and deform the wavefront of an output laser beam.

(ii) The maximum deflection angle is determined by a maximum gradient of the phase distribution, which is further determined by a pitch of the electrodes and the maximum phase difference achieved by each optical phase modulator in the array of optical phase modulators. Therefore, in order to increase the maximum deflection angle, the maximum gradient of the phase distribution has to be increased. That is, it is necessary to decrease the pitch of the electrodes, or to increase the maximum phase difference achieved by each optical phase modulator.

However, when the pitch of the electrodes is decreased, a considerable amount of phase distortion is generated at edge portions of the array of optical phase modulators, and it becomes impossible to realize a desired stepwise phase distribution. In addition, in order to increase the above maximum phase difference achieved by each optical phase modulator, it is necessary to thicken each optical phase modulator. However, when each optical phase modulator is thickened, a large driving voltage is needed, and response becomes slow.

Therefore, it is difficult to increase the maximum deflection angle with the above technique.

(3) Laser Beam Scanning Radiating Apparatus Using Laser Resonator

U.S. Pat. No. 5,600,666 discloses a laser beam scanning and radiating apparatus which generates and scans a laser beam by using a laser resonator.

However, in the above laser beam scanning and radiating apparatus, resonator mirrors must be a phase conjugate mirror. Nevertheless, usually, a passive optical element such as a mirror can achieve the optical phase conjugation only approximately. Therefore, the use of the resonator mirrors causes loss of luminous energy. In addition, the laser beam scanning and radiating apparatus using a laser resonator has a complex construction.

Further, active elements such as nonlinear optical crystals are expensive, and cannot realize a stable phase-conjugate element.

SUMMARY OF THE INVENTION

The object of the present invention is to provide an optical beam deflector which causes neither loss of luminous energy nor deformation of wavefront, has no limit of the maximum deflection angle, guarantees agile, stable, and reliable movement of a beam, has a simple construction, and is inexpensive.

According to the present invention, a crosssection of an incident optical (e.g., laser) beam is divided into a plurality of first micro crosssections, a plurality of phases of the optical beam in the first micro crosssections are respectively modified so that a desired phase gradient is realized over the crosssection of the optical beam, and thereafter the crosssection of the optical beam is further divided into a plurality of second micro crosssections, and a plurality of phases of the optical beam in the second micro crosssections are respectively modified so that the optical beam as a whole is finally directed in a desired direction of deflection or to a desired point.

More concretely, the optical beam deflector according to the first aspect of the present invention contains an array of lenses which collect a first plurality of portions of an incident optical beam into a plurality of spots, respectively; an array of first optical phase modulators which modulate, at or in vicinities of the plurality of spots, phases of the first plurality of portions of the optical beam; a first Fourier transform lens which performs Fourier transformation on the optical beam output from the array of first optical phase modulators to generate a second plurality of portions of the optical beam; an array of second optical phase modulators which modulate phases of the second plurality of portions of the optical beam; an array of second Fourier transform lenses which collect the second plurality of portions of the optical beam after the phases of the second plurality of portions are modulated by the array of second optical phase modulators, and perform inverse Fourier transformation on the second plurality of portions of the optical beam; and a driving unit which drives the arrays of first and second optical phase modulators so that the second plurality of portions of the optical beam which exit from the array of second Fourier transform lenses as a whole are directed in a desired direction of deflection or to a desired point.

In the optical beam deflector according to the first aspect of the present invention, a first plurality of portions of an incident optical beam are collected, by the array of lenses, respectively into a plurality of spots. The phases of the first plurality of portions of the optical beam are modulated by the array of first optical phase modulators at or in vicinities of the plurality of spots. Fourier transformation is performed by the first Fourier transform lens on the optical beam output from the array of first optical phase modulators, to generate a second plurality of portions of the optical beam. The phases of the second plurality of portions of the optical beam are modulated by the array of second optical phase modulators. The second plurality of portions of the optical beam, after the phases of the second plurality of portions are modulated by the array of second optical phase modulators, are collected by the array of second Fourier transform lenses, and inverse Fourier transformation is performed on the second plurality of portions of the optical beam. The driving unit drives the arrays of first and second optical phase modulators so as to realize appropriate phase distributions over the arrays of first and second optical phase modulators, respectively. Thus, the second plurality of portions of the optical beam which exit from the array of second Fourier transform lenses as a whole are directed in a desired direction of deflection or to a desired point.

Preferably, in the above construction of the first aspect of the present invention, the array of lenses, the first Fourier transform lens, and the array of second Fourier transform lenses may be arranged so that the back focal planes of the array of lenses and the front Fourier transform plane of the first Fourier transform lens coincide, and the back Fourier transform plane of the first Fourier transform lens and the front Fourier transform planes of the array of second Fourier transform lenses coincide. In addition, preferably, the array of first optical phase modulators may be located on the back focal planes of the array of lenses, and the array of second optical phase modulators may be located on the front Fourier transform planes of the array of second Fourier transform lenses.

Further, when p1 is the pitch of the array of lenses, N1 is the number of the lenses in the array, f is the focal length of the first Fourier transform lens, f2 is the focal length of the second Fourier transform lenses, p2 is the pitch of the array of second Fourier transform lenses, and $\lambda$ is the wavelength of the optical (laser) beam, it is preferable that the above construction satisfies the following equations (1) and (2).

$$f \times p2 = f2 \times p1 \times N1 \quad (1)$$

$$(p1 \times p2)/(\lambda \times f) = 1 \quad (2)$$

On the other hand, the optical beam deflector according to the second aspect of the present invention does not contain the above first Fourier transform lens and the array of second Fourier transform lenses, and contains an array of second (image-forming) lenses, instead of the array of second Fourier transform lenses in the first aspect of the present invention.

The optical beam deflector according to the second aspect of the present invention contains an array of first lenses which collect a first plurality of portions of an incident optical beam into a plurality of spots; an array of first optical phase modulators which modulate, at or in vicinities of the plurality of spots, phases of the first plurality of portions of the optical beam; an array of second optical phase modulators which modulate phases of a second plurality of portions of the optical beam output from the array of first optical phase modulators; an array of second lenses which collect the second plurality of portions of the optical beam output from the array of second optical phase modulators; and a driving unit which drives the arrays of first and second optical phase modulators so that the optical beam which exits from the array of second lenses as a whole is directed in a desired direction of deflection or to a desired point.

In the optical beam deflectors according to the second aspect of the present invention, a first plurality of portions of an incident optical beam are collected, by the array of lenses, respectively into a plurality of spots. The phases of the first plurality of portions of the optical beam are modulated by the array of first optical phase modulators at or in vicinities of the plurality of spots. The phases of a second plurality of portions of the optical beam output from the array of first optical phase modulators are modulated by the array of second optical phase modulators. The second plurality of portions of the optical beam output from the array of second optical phase modulators are collected by the array of second lenses. The driving unit drives the arrays of first and second optical phase modulators so as to realize appropriate phase distributions over the arrays of first and second optical phase modulators. Thus, the second plurality of portions of the optical beam which exit from the array of second lenses as a whole are directed in a desired direction of deflection or to a desired point.

Preferably, in the above construction of the second aspect of the present invention, the array of first optical phase modulators may be located on the back focal planes of the array of first lenses, and the array of second optical phase modulators may be located on the front focal planes of the array of second lenses.

The optical beam deflectors according to the first and second aspects of the present invention realize deflection without loss of luminous energy and deformation of the wavefront due to dead spots or stripe-shaped electrode areas of the array of optical phase modulators, and enable agile, stable, and reliable scanning. In addition, it is possible to achieve a greater maximum deflection angle than that achieved by the conventional technique since the maximum total phase difference is determined by the numerical aperture (NA) of the array of second Fourier transform lenses (in the first aspect) or the numerical apertures of the array of second lenses (in the second aspect), and depends on neither the maximum phase difference achieved by each optical phase modulator nor the pitches of the arrays of optical phase modulators or Fourier transform lenses. Further, the construction of the optical system is simple and the cost is low since the laser resonator using resonator mirrors having the function of phase conjugation is not used.

In the constructions of the first and second aspects of the present invention, when the incident optical beam is a coherent optical beam such as a laser beam, the driving unit drives the above arrays of first and second optical phase modulators so that wavefronts of the second plurality of portions of the optical beam output from the array of second Fourier transform lenses or second lenses have an identical phase with respect to the above desired direction of deflection or to the above desired point.

In the above case, the incident laser beam may be any kind of laser beam, and the first and second optical phase modulators may be any kind of optical phase modulators.

In addition, when the driving unit appropriately changes the deflection angle of the optical beam output from the optical beam deflector according to the first and second aspects of the present invention, the optical beam can be used as a scanning beam. That is, a scanning apparatus can be realized using the optical beam deflector according to the first and second aspects of the present invention.

Further, when intensity of the optical beam is modulated in the above scanning apparatus, it is possible to change the intensity of the scanning beam.

DESCRIPTION OF THE DRAWINGS

FIG. 1 is a diagram illustrating the construction of the optical beam deflector as the first embodiment of the present invention.

FIG. 2 is a diagram illustrating the relative positions of the respective elements in the construction of the first embodiment.

DESCRIPTION OF PREFERRED EMBODIMENTS

Figure 3A:
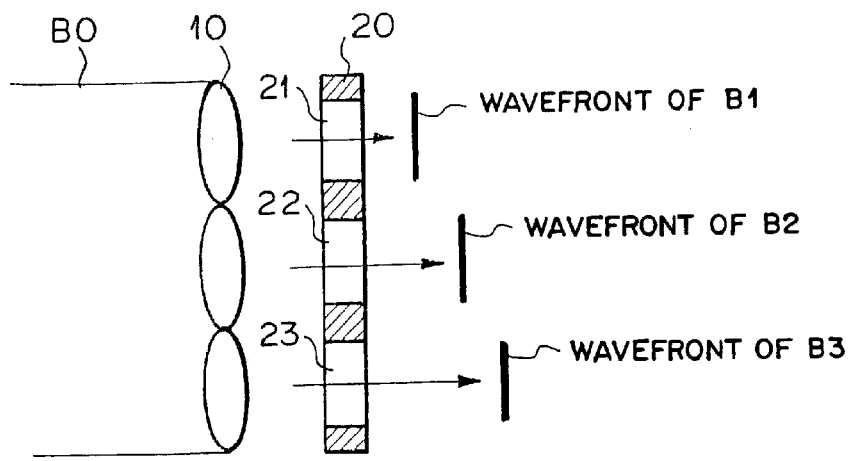
FIGS. 3A is diagram for explaining the operation of the first optical phase modulator array 20.

Embodiments of the present invention are explained in detail below with reference to drawings.

First Embodiment

FIG. 1 is a side view illustrating the construction of the optical beam deflector as the first embodiment of the present invention. The optical beam deflector of FIG. 1 contains a lens array 10, a first optical phase modulator array 20, a Fourier transform lens 30, a second optical phase modulator array 40, a Fourier transform lens array 50, and a driving unit 60.

The lens array 10 is an array of a plurality of lenses, and collects a first plurality of portions (micro crosssections) of an incident laser beam B0 into a plurality of spots, respectively. Although only four lenses are indicated in the vertical direction in FIG. 1 for the sake of simplicity, in practice, a great number of lenses are arranged in the lens array 10. The first optical phase modulator array 20 is an array of optical phase modulators corresponding to the plurality of lenses in the lens array 10. The optical phase modulators in the first optical phase modulator array 20 separately modulate, at the plurality of spots, the phases of the first plurality of portions of the incident laser beam B0 collected by the lens array 10. The Fourier transform lens 30 performs Fourier transformation on the first plurality of portions B1, B2, . . . of the laser beam output from the first optical phase modulator array 20. The second optical phase modulator array 40 is an array of optical phase modulators corresponding to the plurality of lenses in the Fourier transform lens array 50. The plurality of optical phase modulators in the second optical phase modulator array 40 separately modulate phases of the second plurality of portions of the optical beam. The Fourier transform lens array 50 collects the second plurality of portions of the optical beam after the phases of the second plurality of portions have been modulated by the second optical phase modulator array 40. The driving unit 60 drives the first optical phase modulator array 20 and the second optical phase modulator array 40 so that the optical beam which exits from the Fourier transform lens array 50 as a whole is directed in a desired direction of deflection or to a desired point. Although not shown in FIG. 1 as a side view, the elements (lenses or optical phase modulators) in each of the lens array 10, the first optical phase modulator array 20, the Fourier transform lens 30, and the Fourier transform lens array 50 are arranged in a two-dimensional plane corresponding to a crosssection of the laser beam at each array.

FIG. 2 is a diagram illustrating the relative positions of the respective elements in the construction of the first embodiment. Preferably, in the above construction of the first embodiment of the present invention, the lens array 10, the Fourier transform lens 30, and the second Fourier transform lens array 50 may be arranged as illustrated in FIG. 2. That is, the back focal planes t of the lens array 10 and the front Fourier transform plane of the Fourier transform lens 30 coincide, and the back Fourier transform plane u of the Fourier transform lens 30 and the front Fourier transform planes of the second Fourier transform lens array 50 coincide. In addition, the first optical phase modulator array 20 may be located on the back focal planes t of the lens array 10, and the second optical phase modulator array 40 may be located on the front Fourier transform planes u of the Fourier transform lens array 50.

Further, when p1 is the pitch of the lenses in the lens array 10, N1 is the number of the lenses in the lens array 10, f is the focal length of the Fourier transform lens 30, f2 is the focal length of the Fourier transform lenses in the Fourier transform lens array 50, p2 is the pitch of the Fourier transform lenses in the Fourier transform lens array 50, and λ is the wavelength of the laser beam, it is preferable that the above construction satisfies the equal-pitch conditions and the phase conservation condition respectively expressed by the following equations (1) and (2).

$$f \times p2 = f2 \times p1 \times N1 \tag{1}$$

$$(p1 \times p2)/(\lambda \times f) = 1 \tag{2}$$

FIGS. 3A is diagram illustrating the operation of modulating phases of a plurality of portions B1, B2, B3, . . . of the laser beam B0 by the first optical phase modulator array 20. For the sake of simplicity, only the portions B1, B2, and B3 of the laser beam B0 are indicated in FIG. 3A. The driving unit 60 drives the first optical phase modulator array 20 so that wavefronts, having an identical phase, of the portions B1, B2, B3, . . . of the laser beam B0 range along a line inclined at an angle corresponding to each desired direction of deflection.

Figure 3B:
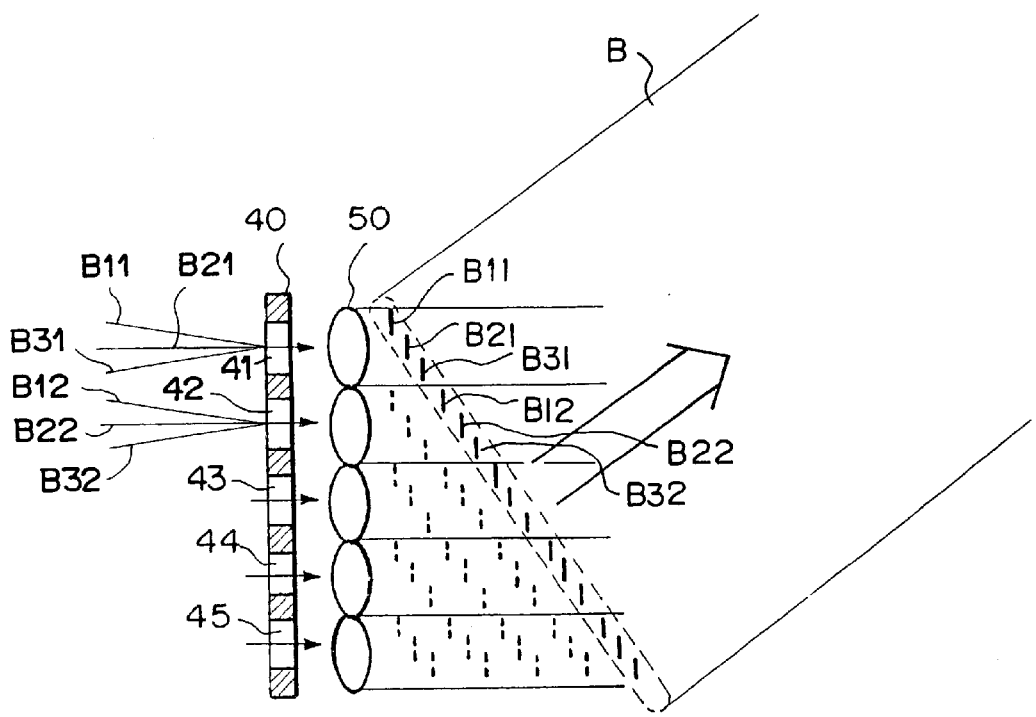
FIG. 3B is diagram for explaining the operation of the second optical phase modulator array 40.

FIG. 3B is diagram for explaining the operation of the second optical phase modulator array 40. After the phases of the portions B1, B2, B3, . . . of the laser beam B0 are modulated by the first optical phase modulator array 20, the portions B1, B2, B3, . . . of the laser beam B0 are further divided into a plurality of sub-portions B11, B21, B31, . . . , B12, B22, B32, . . . , B13, B23, B33 . . . B1i, B2i, B3i, . . . by the Fourier transform lens 30. The sub-portions B11, B21, B31, . . . are collected by the first Fourier transform lens in the second Fourier transform lens array 50, the sub-portions B12, B22, B32, . . . are collected by the second Fourier transform lens in the second Fourier transform lens array 50, the sub-portions B13, B23, B33, are collected by the third Fourier transform lens in the second Fourier transform lens array 50, and so forth. For the sake of simplicity, only the portions B1, B2, and B3 of the laser beam B0 and the corresponding sub-portions B11, B21, B31, B12, B22, B32, B13, B23, and B33 are indicated in FIG. 3B. Before being collected by the Fourier transform lens array 50, phases of the above sub-portions are respectively modulated by the optical phase modulators in the second optical phase modulator array 40. That is, the phases of the sub-portions B11, B21, B31, . . . are modulated by the first optical phase modulator in the second optical phase modulator array 40, the phases of the sub-portions B12, B22, B32, . . . are modulated by the second optical phase modulator in the second optical phase modulator array 40, the phases of the sub-portions B13, B23, B33, . . . are modulated by the third optical phase modulator in the second optical phase modulator array 40, and so forth. The driving unit 60 drives the second optical phase modulator array 40 so that wavefronts, having an identical phase, of all of the sub-portions B11, B21, B31, B12, B22, B32, B13, B23, B33, . . . of the laser beam B0 range along a line inclined at an angle perpendicular to a desired direction of deflection. Thus, the laser beam B output from the Fourier transform lens array 50 is directed in the desired direction of deflection. In this example, an additive phase amount added to the phases of the corresponding sub-portions of the laser beam in the modulation by each optical phase modulator in the second optical phase modulator array 40 differs by 2p×N from an additive phase amount added to the phases of the corresponding sub-portions of the laser beam in the modulation by an adjacent optical phase modulator in the second optical phase modulator array 40, where N is an integer.

The operations of the optical beam deflector 100 in FIG. 1 are explained below in detail.

First, a plane-wave laser beam B0 is incident on the lens array 10 along the x-axis from the left side of the optical beam deflector 100 in FIG. 1. A plurality of portions of the incident laser beam B0 are respectively collected, by the lenses constituting the lens array 10, into a plurality of spots located on the back focal planes t of the lens array 10. In this case, the plurality of spots are approximated by a Sinc function, and the amplitude distribution $\Phi(t)$ on the back focal planes t is expressed by the following equation (3).

$$\Phi(t) = \frac{p1}{\sqrt{i\lambda f1}} \sum_{l1=-L1}^{L1} \mathrm{Sinc}\left[\frac{p1}{\lambda f1}(t - l1p1)\right] \tag{3}$$

Next, the laser beam having the above amplitude distribution $\Phi(t)$ passes through the first optical phase modulator array 20. A complex amplitude distribution $\Phi_1(t)$ of the laser beam after having passed through the first optical phase modulator array 20 is expressed by the following equations (4).

$$\Phi_1(t) = \frac{p1}{\sqrt{i\lambda f1}} \sum_{l1=-L1}^{L1} \mathrm{Sinc}\left[\frac{p1}{\lambda f1}(t - l1p1)\right]\exp(i\phi l1) \tag{4}$$

While the laser beam having the complex amplitude distribution $\Phi_1(t)$ passes through the Fourier transform lens 30, the complex amplitude distribution $\Phi_1(t)$ is subject to Fourier transformation, and the Fourier transformed complex amplitude distribution $\Theta(u)$ is formed on the back Fourier transform plane u of the Fourier transform lens 30. The Fourier transformed complex amplitude distribution $\Theta(u)$ is expressed by the following equation (5).

$$\Theta(u) = -i\sqrt{\frac{f1}{f}}\,\mathrm{Rec}t\!\left(\frac{f1u}{p1f}\right)\sum_{l1=-L1}^{L1}\exp\!\left[i\phi l1 - 2\pi i\frac{l1p1}{\lambda r}u\right] \tag{5}$$

While the laser beam having the complex amplitude distribution $\Theta(u)$ passes through the second optical phase modulator array 40 and the Fourier transform lens array 50, the phases of the respective portions of the laser beam are modulated by the second optical phase modulator array 40, and the amplitude distribution $\Theta(u)$ is subject to inverse Fourier transformation by Fourier transform lenses constituting the Fourier transform lens array 50. Thus, a complex amplitude distribution $\Psi(v)$ of the laser beam after the phase modulation and the inverse Fourier transformation is formed on the back Fourier transform planes v of the Fourier transform lens array 50. The complex amplitude distribution $\Psi(v)$ is expressed by the following equation (6).

$$\Psi(v) = -p2\sqrt{\frac{if1}{\lambda f2f}}\sum_{l1=-L1}^{L1}\sum_{l2=-L2}^{L2}\exp\!\left(-\frac{2\pi i}{\lambda f}l1l2p1p2\right) \tag{6}$$

$$\exp(i\phi l1 + i\psi l2)\mathrm{Sinc}\!\left[\frac{p2}{\lambda f2}\!\left(v + \frac{p1f2l1}{f} - p2l2\right)\right]$$

The first exponential factor in the equation (6) is equal to one when the equation (2) exists. Thus, in the complex amplitude distribution of the laser beam having passed through the second optical phase modulator array 40 and the Fourier transform lens array 50, a plurality of portions of the phase distribution generated by the modulation by the first and second optical phase modulator arrays 20 and 40 are located with the pitch of the Fourier transform lens array 50.

When the equation (1) exists, the equation (6) is rewritten as the following equation (7).

$$\Psi(v) = -p2\sqrt{\frac{if1}{\lambda f2f}}\sum_{l1=-L1}^{L1}\sum_{l2=-L2}^{L2}\exp(i\phi l1 + i\psi l2) \tag{7}$$

$$\mathrm{Sinc}\!\left[\frac{p2}{\lambda f2}\!\left(v + \frac{p2l1}{N1} - p2l2\right)\right]$$

As is clear from the equation (7), in the complex amplitude distribution of the laser beam having passed through the second optical phase modulator array 40 and the Fourier transform lens array 50, a plurality of peaks represented by the Sync function range at regular intervals, and a plurality of portions of the phase distribution generated by the modulation of the first and second optical phase modulator arrays 20 and 40 are located with the pitch of the Fourier transform lens array 50.

Therefore, when the driving unit 60 is configured so that the first and second optical phase modulator arrays 20 and 40 provide appropriate additive phases $\phi 11$ and $\psi 12$ to the phases of the respective portions of the laser beam, and realize a phase distribution having an identical phase with respect to a desired direction, a plane-wave laser beam B traveling in the above desired direction can be generated.

Thus, when the optical beam deflector of FIG. 1 satisfies the aforementioned the equal-pitch conditions and the phase conservation condition respectively expressed by the following equations (1) and (2), and the driving unit 60 is configured as above so as to realize a desired phase distribution in the laser beam by the first and second optical phase modulator arrays 20 and 40, a plane-wave laser beam B0 incident on the lens array 10 can be transformed to a plane-wave laser beam B which exits from the Fourier transform lens array 50 and travels in the desired direction.

Incidentally, it is not necessary to precisely satisfy the above conditions indicated by the equations (1) and (2). In this case, if appropriate additive phase amounts are provided by the first and second optical phase modulator arrays 20 and 40, the laser beam outgoing from the Fourier transform lens array 50 becomes a divergent light beam or a convergent light beam with respect to a desired point. Therefore, it is possible to scan a desired point by a divergent light beam or a convergent light beam.

Figure 4A:
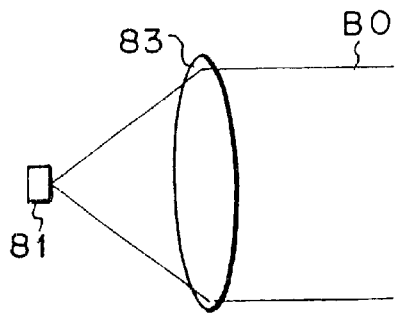
FIGS. 4A and 4B are diagrams each illustrating a mode of generation of the incident optical beam B0.
Figure 4B:
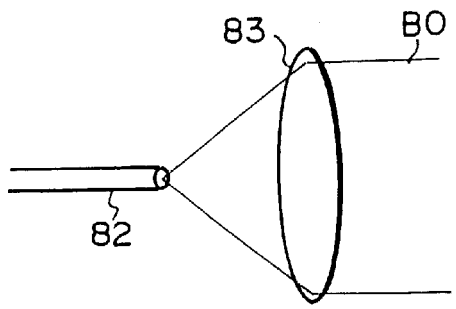

In addition, in the above embodiment, the incident plane-wave laser beam B0 may be generated in any manner. For example, the incident plane-wave laser beam B0 may be generated by collimating by a lens 83 a divergent light emitted from a semiconductor laser device 81, as illustrated in FIG. 4A, or a fan beam emitted from an optical fiber 82, as illustrated in FIG. 4B.

Second Embodiment

Figure 5:
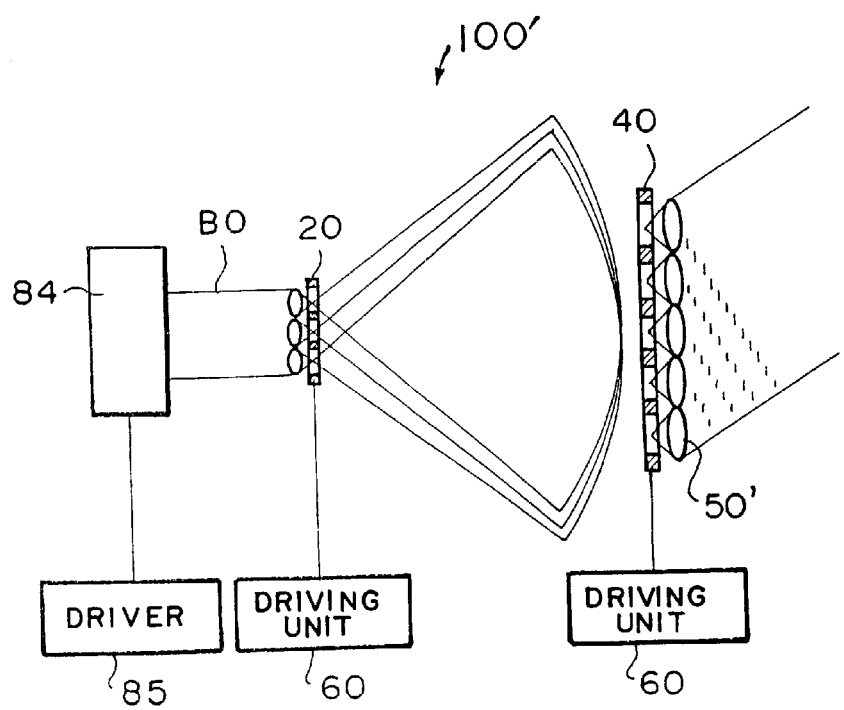
FIG. 5 is a diagram illustrating the construction of the optical beam deflector as the second embodiment of the present invention.

FIG. 5 is a diagram illustrating the construction of the optical beam deflector as the second embodiment of the present invention.

The optical beam deflector 100' of FIG. 5 is different from the optical beam deflector 100 of FIG. 1, in that the optical beam deflector 100' of FIG. 5 does not contain the Fourier transform lens 30, and contains a second (image-forming) lens array 50' instead of the Fourier transform lens array 50 in FIG. 1.

In the optical beam deflector 100' as the second embodiment, Fourier transformation is not performed. Instead, the first lens array 10 forms, on the back focal planes of the lenses of the first lens array 10, a plurality of spots from the plurality of portions of the laser beam B0, and images of the plurality of spots are further formed by each lens in the second lens array 50'. The first and second optical phase modulator arrays 20 and 40 are driven by the driving unit 60 to modulate the phases of the respective portions of the laser beam in a similar manner to the first embodiment, so that the outgoing laser beam has a complex amplitude distribution having an identical phase with respect to a desired point or a desired direction of deflection. Thus, the optical beam deflector 100' as the second embodiment of the present invention can also deflect a laser beam to a desired direction or to a desired point.

First Application

Figure 6:
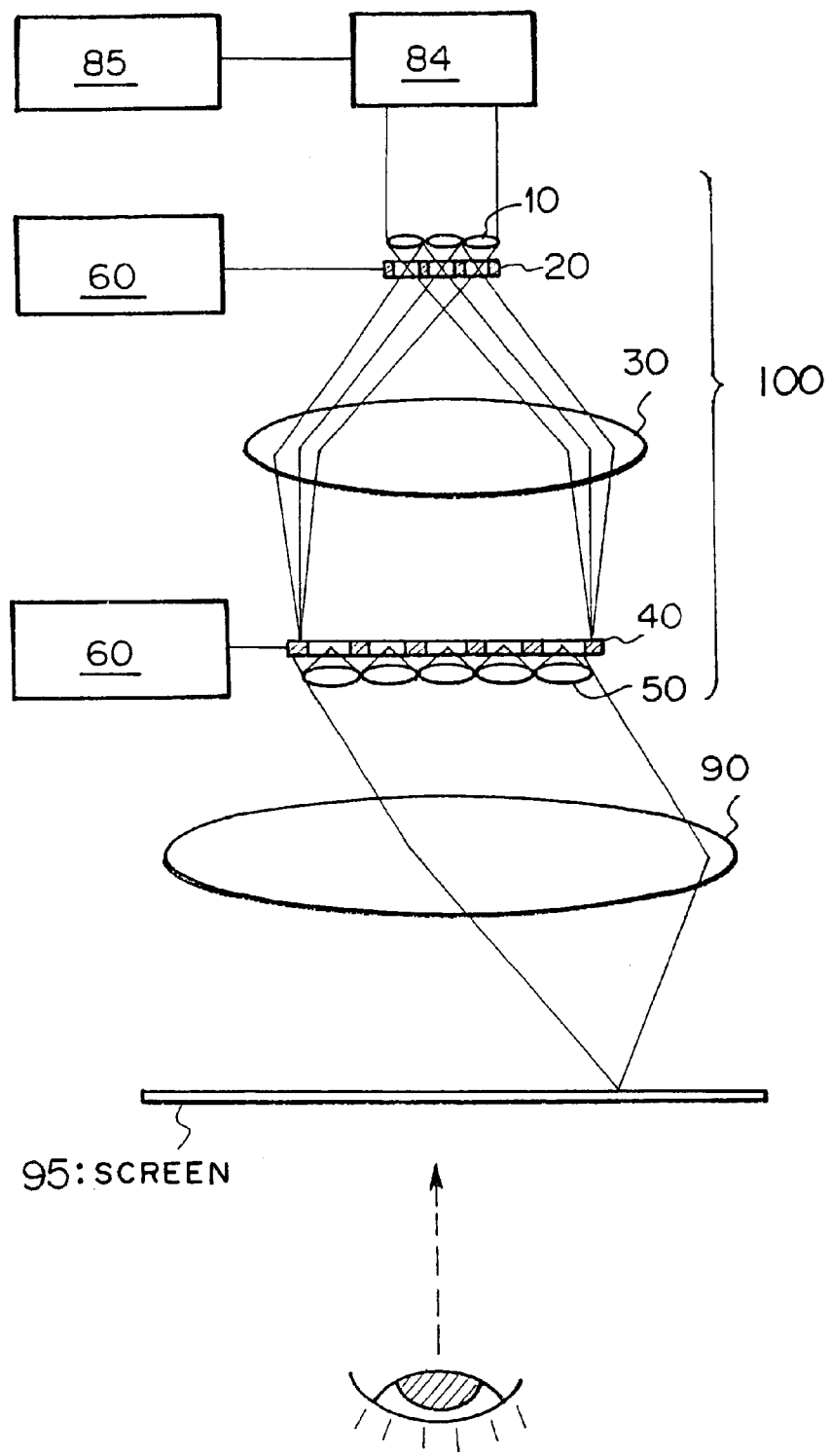
FIG. 6 is a diagram illustrating the construction of a two-dimensional high-resolution image display apparatus utilizing the optical beam deflector according to the present invention.

FIG. 6 is a diagram illustrating the construction of a two-dimensional high-resolution image display apparatus utilizing the optical beam deflector according to the present invention.

The image display apparatus in FIG. 6 contains the optical beam deflector 100 in FIG. 1, a laser source 84, a driver unit 85, a lens 90, and a screen 95. The laser source 84 generates and emits a laser beam to be incident on the optical beam deflector 100. The driver 85 drives the laser source 84, and can modulate the incident laser beam according to image data to be displayed on the screen 95.

The lens 90 collects the laser beam output from the optical beam deflector 100 into a spot on the screen 95. Thus, the image represented by the image data can be displayed on the screen 95 by deflecting the output laser beam under the control of the driving unit 60 in the optical beam deflector 100 for scanning, and modulating the intensity of the incident laser beam according to the image data by the driver 85. Otherwise, instead of the optical beam deflector 100 in FIG. 1, the optical beam deflector 100' in FIG. 5 can be used in the image display apparatus in FIG. 6.

Second Application

Figure 7:
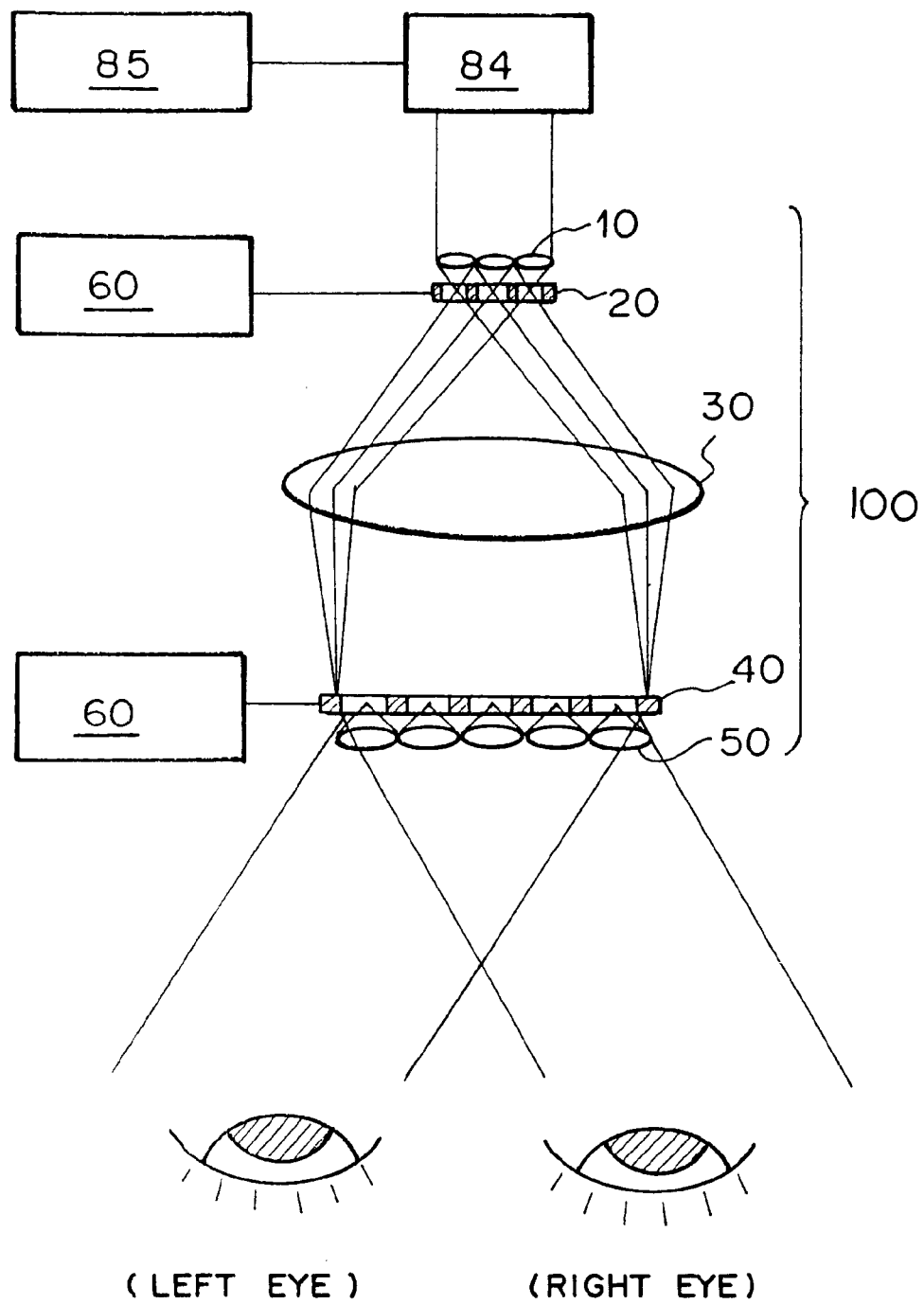
FIG. 7 is a diagram illustrating the construction of a three-dimensional image display apparatus utilizing the optical beam deflector according to the present invention.

FIG. 7 is a diagram illustrating the construction of a three-dimensional image display apparatus utilizing the optical beam deflector according to the present invention.

The image display apparatus in FIG. 7 contains the optical beam deflector 100 in FIG. 1, the laser source 84, and a driver unit 85'. The laser source 84 generates and emits a laser beam to be incident on the optical beam deflector 100. The driver 85' drives the laser source 84, and can modulate the incident laser beam according to image data to be observed by right and left eyes. Thus, an image represented by the image data can be observed by right and left eyes by deflecting the output laser beam under the control of the driving unit 60 in the optical beam deflector 100, and modulating the intensity of the incident laser beam according to the image data by the driver 85'. If the output laser beam is quickly switched between two directions, one being directed to the right eye and the other to the left eye, during the above operations of scanning the output laser beam and modulating the intensity of the incident laser beam, it is possible to generate an appropriate parallax for binocular observation of a three-dimensional image. That is, the construction of FIG. 7 realizes a three-dimensional image display apparatus.

Otherwise, instead of the optical beam deflector 100 in FIG. 1, the optical beam deflector 100' in FIG. 5 can be used in the image display apparatus in FIG. 7.

In addition, all of the contents of the Japanese Patent Application No. 11(1999)-57212 are incorporated into this specification by reference.

What is claimed is:

1. An optical beam deflector comprising:

an array of lenses which collect a first plurality of portions of an optical beam into a plurality of spots, respectively;

an array of first optical phase modulators which modulate, at or in vicinities of the plurality of spots, phases of the first plurality of portions of the optical beam;

a first Fourier transform lens which performs Fourier transformation on the optical beam output from the array of first optical phase modulators, to generate a second plurality of portions of the optical beam;

an array of second optical phase modulators which modulate phases of said second plurality of portions of the optical beam;

an array of second Fourier transform lenses which collect the second plurality of portions of the optical beam after the phases of the second plurality of portions are modulated by the array of second optical phase modulators, and perform inverse Fourier transformation on the second plurality of portions of the optical beam; and a driving unit which drives said arrays of first and second optical phase modulators so that the second plurality of portions of the optical beam which exit from the array of second Fourier transform lenses as a whole are directed in a desired direction of deflection or to a desired point.

2. An optical beam deflector according to claim 1, wherein said incident optical beam is a coherent optical beam such as a laser beam, and the driving unit drives said arrays of first and second optical phase modulators so that wavefronts of the second plurality of portions of the optical beam which exit from the array of second Fourier transform lenses have an identical phase with respect to said desired direction of deflection or with respect to said desired point.

3. An optical beam deflector according to claim 1, wherein when p1 is a pitch of the array of lenses, N1 is the number of the lenses in the array, f is a focal length of the first Fourier transform lens, f2 is a focal length of the second Fourier transform lenses, p2 is a pitch of the array of second Fourier transform lenses, and $\lambda$ is a wavelength of the optical beam, $f \times p2 = f2 \times p1 \times N1$, and $(p1 \times p2)/(\lambda \times f) = 1$.

4. An optical beam deflector comprising:

an array of first lenses which collect a first plurality of portions of an optical beam into a plurality of spots;

an array of first optical phase modulators which modulate, at or in vicinities of the plurality of spots, phases of the first plurality of portions of the optical beam;

an array of second optical phase modulators which modulate phases of a second plurality of portions of the optical beam output from the array of first optical phase modulators;

an array of second lenses which collect the second plurality of portions of the optical beam output from the array of second optical phase modulators; and a driving unit which drives said arrays of first and second optical phase modulators so that the second plurality of portions of the optical beam which exit from the array of second lenses as a whole are directed in a desired direction of deflection or to a desired point.

5. An optical beam deflector according to claim 4, wherein said incident optical beam is a coherent optical beam such as a laser beam, and the driving unit drives said arrays of first and second optical phase modulators so that wavefronts of the second plurality of portions of the optical beam output from the array of second lenses have an identical phase with respect to said desired direction of deflection or with respect to said desired point.

* * * * *